United States Patent
Chen et al.

(10) Patent No.: US 12,055,169 B2
(45) Date of Patent: Aug. 6, 2024

(54) SUPPORTING DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 218 days.

(21) Appl. No.: 17/505,807

(22) Filed: Oct. 20, 2021

(65) Prior Publication Data
US 2023/0029230 A1  Jan. 26, 2023

(30) Foreign Application Priority Data
Jul. 26, 2021 (TW) .................................. 110127629

(51) Int. Cl.
*F16B 12/10* (2006.01)
*A47B 96/14* (2006.01)

(52) U.S. Cl.
CPC .......... *F16B 12/10* (2013.01); *A47B 96/1408* (2013.01)

(58) Field of Classification Search
CPC ..... F16B 12/10; A47B 96/1408; H05K 7/183; H05K 7/1489
See application file for complete search history.

(56) References Cited

U.S. PATENT DOCUMENTS

| | | | |
|---|---|---|---|
| 5,470,143 A | 11/1995 | Gill | |
| 6,398,041 B1* | 6/2002 | Abbott | H05K 7/1489 361/829 |
| 6,769,551 B2* | 8/2004 | Rafferty | H05K 7/1492 211/192 |
| 7,975,860 B2* | 7/2011 | Dittus | H05K 7/1489 211/207 |
| 8,662,317 B2* | 3/2014 | Liang | H05K 7/1489 361/829 |
| 8,727,138 B2 | 5/2014 | Dittus et al. | |
| 8,770,528 B2 | 7/2014 | Chen et al. | |
| 11,647,836 B2* | 5/2023 | Chen | A47B 57/32 211/162 |
| 2011/0233355 A1 | 9/2011 | Peng et al. | |
| 2014/0175033 A1 | 6/2014 | Chen et al. | |
| 2015/0173510 A1 | 6/2015 | Yu et al. | |

FOREIGN PATENT DOCUMENTS

TW      202005505 A    1/2020

* cited by examiner

*Primary Examiner* — Kimberly T Wood
(74) *Attorney, Agent, or Firm* — Rosenberg, Klein & Lee

(57) ABSTRACT

A supporting device is adapted to be mounted on a rack and includes a longitudinal portion, a first mounting portion, and an elastic member. The first mounting portion and the elastic member are both provided on the longitudinal portion. The elastic member is configured to be in one of a locking state and a non-locking state. The elastic member is provided with a second mounting portion. When the first mounting portion is mounted on the rack and the elastic member is in the non-locking state, the second mounting portion is not mounted on the rack. When the first mounting portion is mounted on the rack and the elastic member is in the locking state, the second mounting portion is mounted on the rack.

18 Claims, 12 Drawing Sheets

SUPPORTING DEVICE

FIELD OF THE INVENTION

The present invention relates to a supporting device and more particularly to a supporting device for use with a rack.

BACKGROUND OF THE INVENTION

U.S. Pat. No. 8,727,138 B2 discloses a slide rail that can be installed on and removed from a rack without using a tool. The slide rail can be used to support an object (e.g., the chassis of a piece of electronic equipment). The two ends of the slide rail are each provided with a latch assembly and can be mounted on a front vertical rack rail (or post) and a rear vertical rack rail (or post) of the rack via the latch assemblies respectively. When the two longitudinal pins of each latch assembly are inserted respectively into the corresponding holes of the corresponding vertical rack rail, and the first latch arm and the second latch arm of each latch assembly are at a locking position due to the elastic force of an elastic member and thus locked to the corresponding vertical rack rail (as shown in FIG. 7A of the '138 patent), the slide rail is mounted and locked on the rack. A user may manually operate the release handle of each latch assembly in order to drive the corresponding first and second latch arms from the locking position to an unlocking position (as shown in FIG. 7B of the '138 patent), thereby allowing the corresponding two pins to be moved out of the corresponding holes of the corresponding vertical rack rail respectively, and the slide rail to be subsequently detached from the rack.

U.S. Pat. No. 8,770,528 B2 discloses a support frame assembly that can be mounted on a front post and a rear post of a rack via a front bracket and a rear bracket respectively. The front bracket and the rear bracket have substantially the same structural configuration. For example, the front bracket includes a plurality of connection members and a fastening member, and the connection members can be longitudinally inserted into the corresponding holes of the front post respectively, with the fastening member (or more specifically a fastening portion thereof) locked to the front post by the elastic force of a resilient leg. Thus, the two brackets can mount the support frame assembly on the rack.

It can be known from the above that the latch arms or fastening member disclosed in each of the foregoing two patents can be brought to a locking position by an elastic force and thus locked to a rack. This also means that the elastic force must be overcome in order to unlock the latch arms or fastening member from the rack (i.e., to move the latch arms or fastening member from the locking position to an unlocking portion), or the slide rail or support frame assembly cannot be detached from the rack. Such a design, however, is inconvenient to the user, especially when it is required to manually remove the elastic force from both the front bracket and the rear bracket.

In view of the evolution of market demands and rack designs, it is worthwhile to develop a different product from those described above.

SUMMARY OF THE INVENTION

The present invention relates to a supporting device for use with a rack.

According to one aspect of the present invention, a supporting device is adapted to be mounted on a rack. The supporting device includes a longitudinal portion, a first mounting portion, and an elastic member. The first mounting portion is provided on the longitudinal portion. The elastic member is also provided on the longitudinal portion and is configured to be in one of a locking state and a non-locking state. The elastic member is provided with a second mounting portion. When the first mounting portion is mounted at a first predetermined position on the rack and a force is applied to the elastic member, the elastic member is changed from the non-locking state to the locking state such that the second mounting portion is mounted at a second predetermined position on the rack to prevent the first mounting portion from moving away from the first predetermined position on the rack.

Preferably, when the first mounting portion is mounted at the first predetermined position on the rack but the force is not applied to the elastic member, the elastic member is in the non-locking state, and the second mounting portion is therefore not mounted at the second predetermined position on the rack such that the first mounting portion is allowed to move away from the first predetermined position on the rack.

Preferably, the supporting device further includes a supporting portion bent with respect to the longitudinal portion. The supporting portion is configured to support an object, and the object can apply the force and thereby depress the elastic member such that the elastic member is changed from the non-locking state to the locking state.

Preferably, the longitudinal portion has two opposite sides defined respectively as a first side and a second side, and the elastic member includes a connecting portion, a guiding portion, and an elastic portion provided between the connecting portion and the guiding portion. The connecting portion is connected to the first side of the longitudinal portion, and the elastic portion is tilted up with respect to the first side.

Preferably, the longitudinal portion includes a through hole, the through hole brings the first side and the second side into communication with each other, and the second mounting portion is provided on the elastic portion of the elastic member and is configured to be passed from the first side through the through hole to the second side.

Preferably, the supporting portion is substantially perpendicularly connected to the longitudinal portion.

Preferably, the rack includes a front post and a rear post, each including a plurality of mounting holes, and the longitudinal portion has a first end and a second end. The first mounting portion is adjacent to the first end of the longitudinal portion, and the longitudinal portion is further provided with an auxiliary mounting portion adjacent to the second end of the longitudinal portion. The first mounting portion is configured to be mounted at the first predetermined position of any of the mounting holes of the front post, and the auxiliary mounting portion is configured to be mounted at the first predetermined position of any of the mounting holes of the rear post.

Preferably, each of the first mounting portion and the auxiliary mounting portion includes a first extension section and a second extension section. The first extension sections are connected to the longitudinal portion. Each second extension section is bent with respect to the corresponding first extension section. Each first extension section and the corresponding second extension section jointly constitute a hook to be hung on a hole wall of any of the mounting holes of the front post or of the rear post.

Preferably, each second extension section is substantially perpendicularly connected to the corresponding first extension section.

Preferably, when the first mounting portion is hung on the hole wall of one of the mounting holes, the first extension section of the first mounting portion is supported by the hole wall, and the second extension section of the first mounting portion is spaced apart from the front post by a transverse distance. The transverse distance allows the supporting device to be displaced transversely with respect to the rack.

According to another aspect of the present invention, a supporting device includes a longitudinal portion, a first mounting portion, and an elastic member. The first mounting portion is provided on the longitudinal portion. The elastic member is also provided on the longitudinal portion and is configured to be in one of a locking state and a non-locking state. The elastic member is provided with a second mounting portion. The second mounting portion is relatively far away from the first mounting portion when the elastic member is in the non-locking state, and the second mounting portion is relatively close to the first mounting portion when the elastic member is in the locking state.

Preferably, the elastic member is in the non-locking state when a force is not applied to the elastic member.

According to yet another aspect of the present invention, a supporting device is adapted to be mounted on a rack that includes a first post with a plurality of mounting holes. The supporting device includes a longitudinal portion, a first mounting portion, and a second mounting portion. The first mounting portion and the second mounting portion are both provided on the longitudinal portion. The first mounting portion includes a first extension section and a second extension section. The first extension section is connected to the longitudinal portion. The second extension section is bent with respect to the first extension section. The first extension section and the second extension section jointly constitute a hook to be hung on a hole wall of any of the mounting holes of the first post and thus located at a first predetermined position. When the first mounting portion is hung on the hole wall of one of the mounting holes, the first extension section of the first mounting portion is supported by the hole wall, and the second extension section of the first mounting portion is spaced apart from the first post by a transverse distance. The transverse distance allows the supporting device to be displaced transversely with respect to the rack. When the supporting device reaches a second position after being transversely displaced with respect to the rack from a first position, the second mounting portion is mounted at a second predetermined position on the rack to prevent the first mounting portion from moving away from the first predetermined position on the rack.

Preferably, the first extension section of the first mounting portion has a first transverse length, and the second mounting portion has a second transverse length less than the first transverse length.

Preferably, when the first mounting portion is mounted at the first predetermined position on the rack but the second mounting portion is not mounted at the second predetermined position on the rack, the first mounting portion is allowed to move away from the first predetermined position on the rack.

Preferably, the supporting device further includes a supporting portion bent with respect to the longitudinal portion. The supporting portion is configured to support an object, and the object can drive the supporting device into transverse displacement from the first position to the second position with respect to the rack.

Preferably, the supporting portion is substantially perpendicularly connected to the longitudinal portion.

Preferably, the rack further includes a second post with a plurality of mounting holes, and the longitudinal portion has a first end and a second end. The first mounting portion is adjacent to the first end of the longitudinal portion, and the longitudinal portion is further provided with an auxiliary mounting portion adjacent to the second end of the longitudinal portion. The first mounting portion is configured to be mounted at the first predetermined position of any of the mounting holes of the first post, and the auxiliary mounting portion is configured to be mounted at the first predetermined position of any of the mounting holes of the second post.

Preferably, the auxiliary mounting portion has substantially the same structural configuration as the first mounting portion, and the auxiliary mounting portion is configured to be hung on a hole wall of any of the mounting holes of the second post.

Preferably, the second extension section is substantially perpendicularly connected to the first extension section.

DETAILED DESCRIPTION OF THE INVENTION

Figure 1:
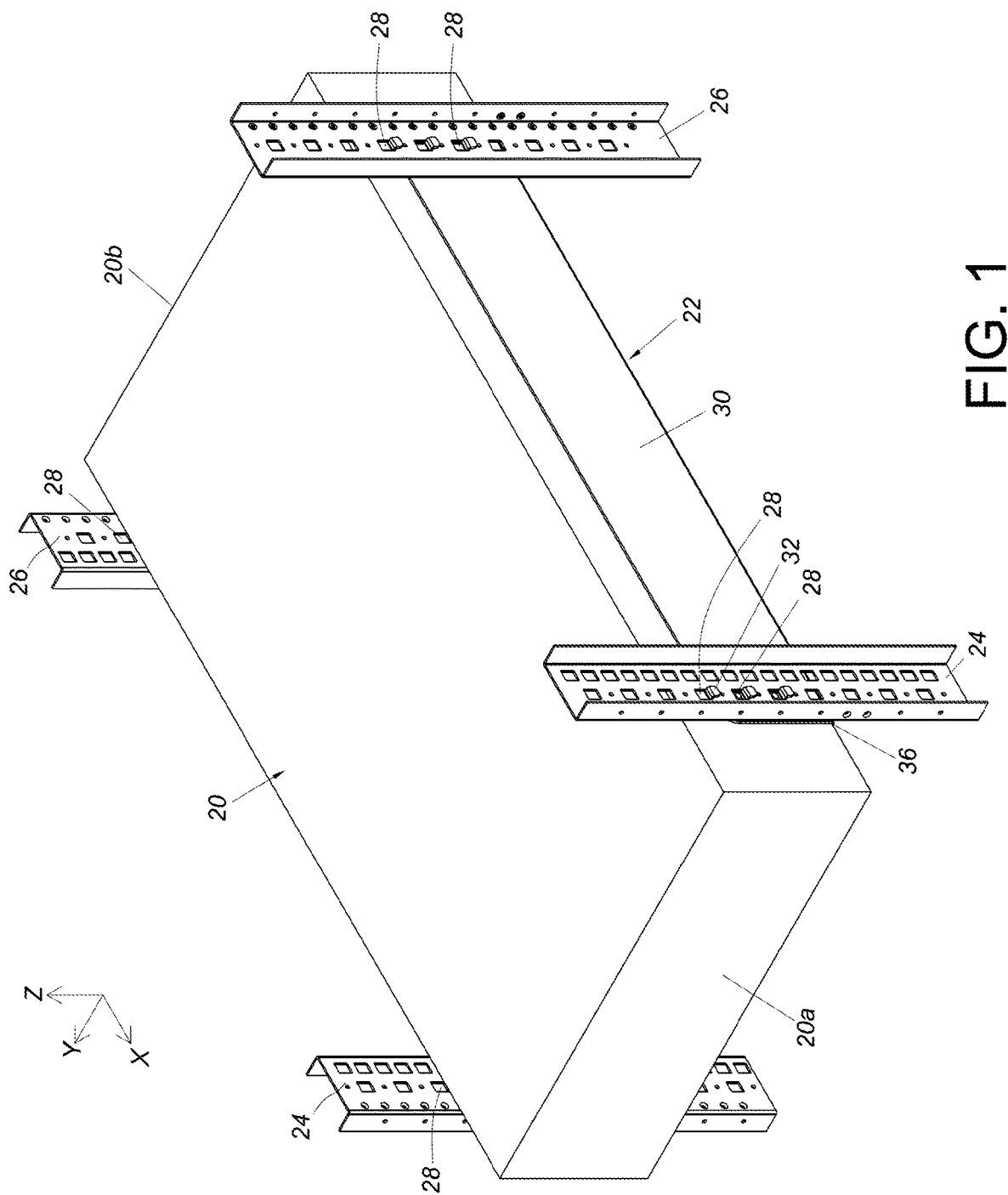
FIG. 1 is a perspective view showing an object mounted on a rack via a pair of supporting devices according to an embodiment of the present invention.
Figure 2:
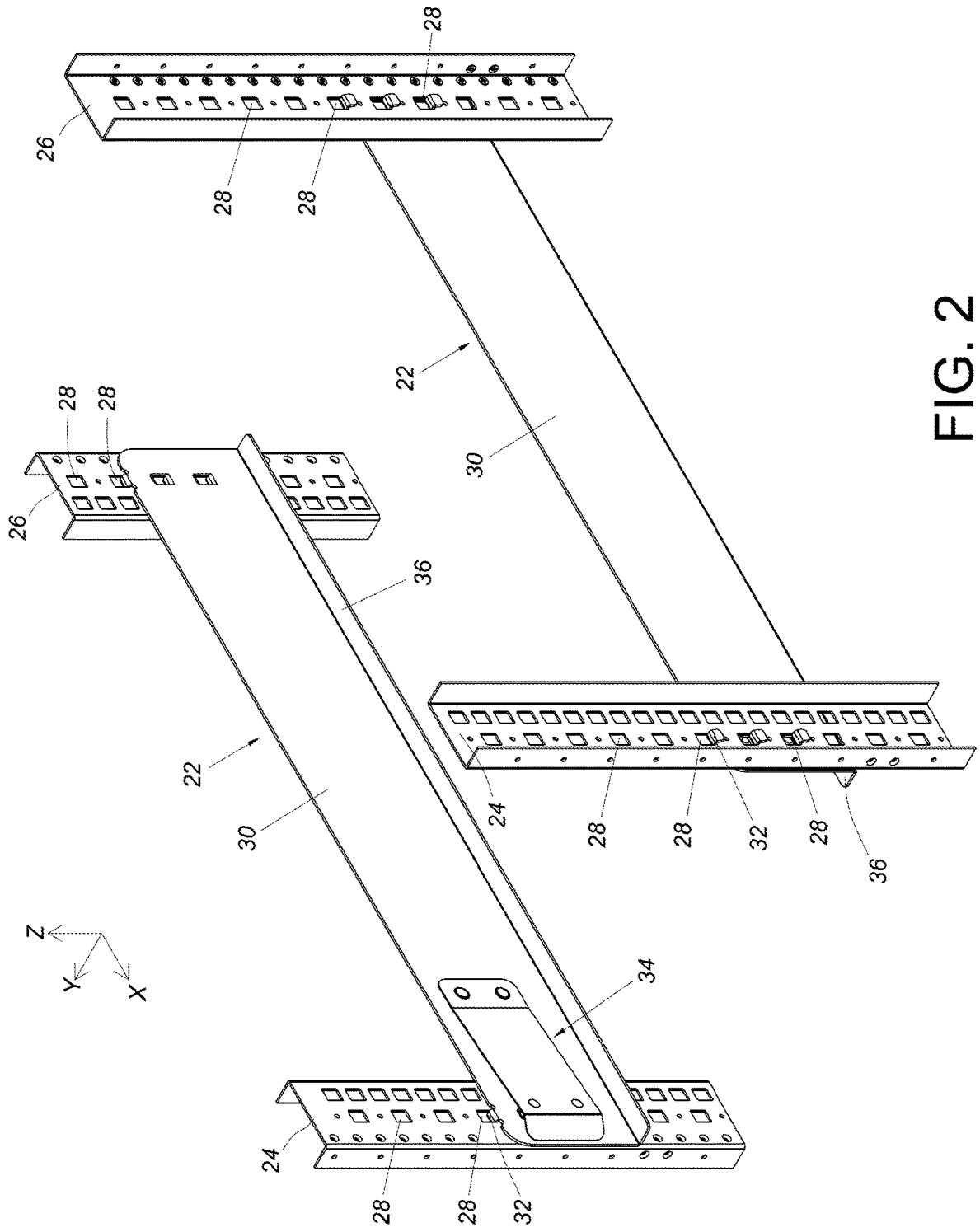
FIG. 2 is a perspective view showing that the pair of supporting devices according to the embodiment of the present invention are mounted on the rack.

Referring to FIG. 1 and FIG. 2, a pair of supporting devices 22 according to an embodiment of the present invention can be used to mount an object 20 on a rack. The object 20 has a front portion 20a and a rear portion 20b. The rack has a left side and a right side that have substantially the same structural configuration. For example, the left side of the rack includes at least one post, such as but not limited to a first post 24 (e.g., a front post) and a second post 26 (e.g., a rear post), wherein the first post 24 and the second post 26 have substantially the same structural configuration (for example, both the first post 24 and the second post 26 include a plurality of mounting holes 28 that are arranged at intervals along the height direction of the first and the second posts 24 and 26). The pair of supporting devices 22 have substantially the same structural configuration. Each supporting device 22 includes a longitudinal portion 30, at least one first mounting portion 32, and an elastic member 34. Preferably, each supporting device 22 further includes a supporting portion 36 bent with respect to the corresponding longitudinal portion 30, and each supporting portion 36 is substantially perpendicularly connected to the corresponding longitudinal portion 30 and is configured to support a bottom portion of the object 20.

It is worth mentioning that in the coordinate system used in FIG. 1 and FIG. 2, the X-axis direction is defined as the longitudinal direction, the Y-axis direction as the transverse (or lateral) direction, and the Z-axis direction as the vertical direction (or the height direction of the first and the second posts 24 and 26). The X axis, the Y axis, and the Z axis are perpendicular to one another.

Figure 3:
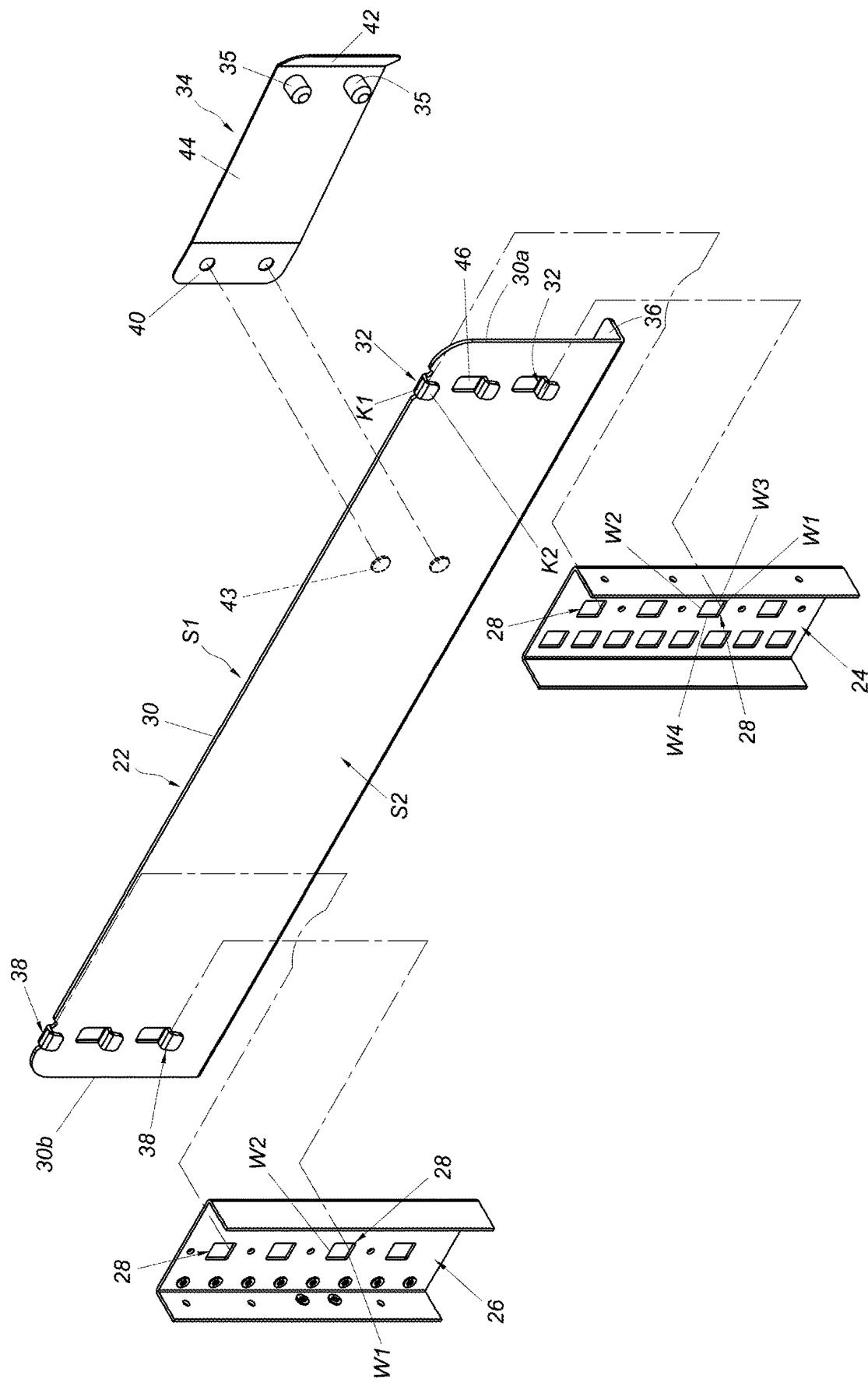
FIG. 3 is an exploded perspective view of one of the supporting devices according to the embodiment of the present invention, with the supporting device detached from the rack.
Figure 4:
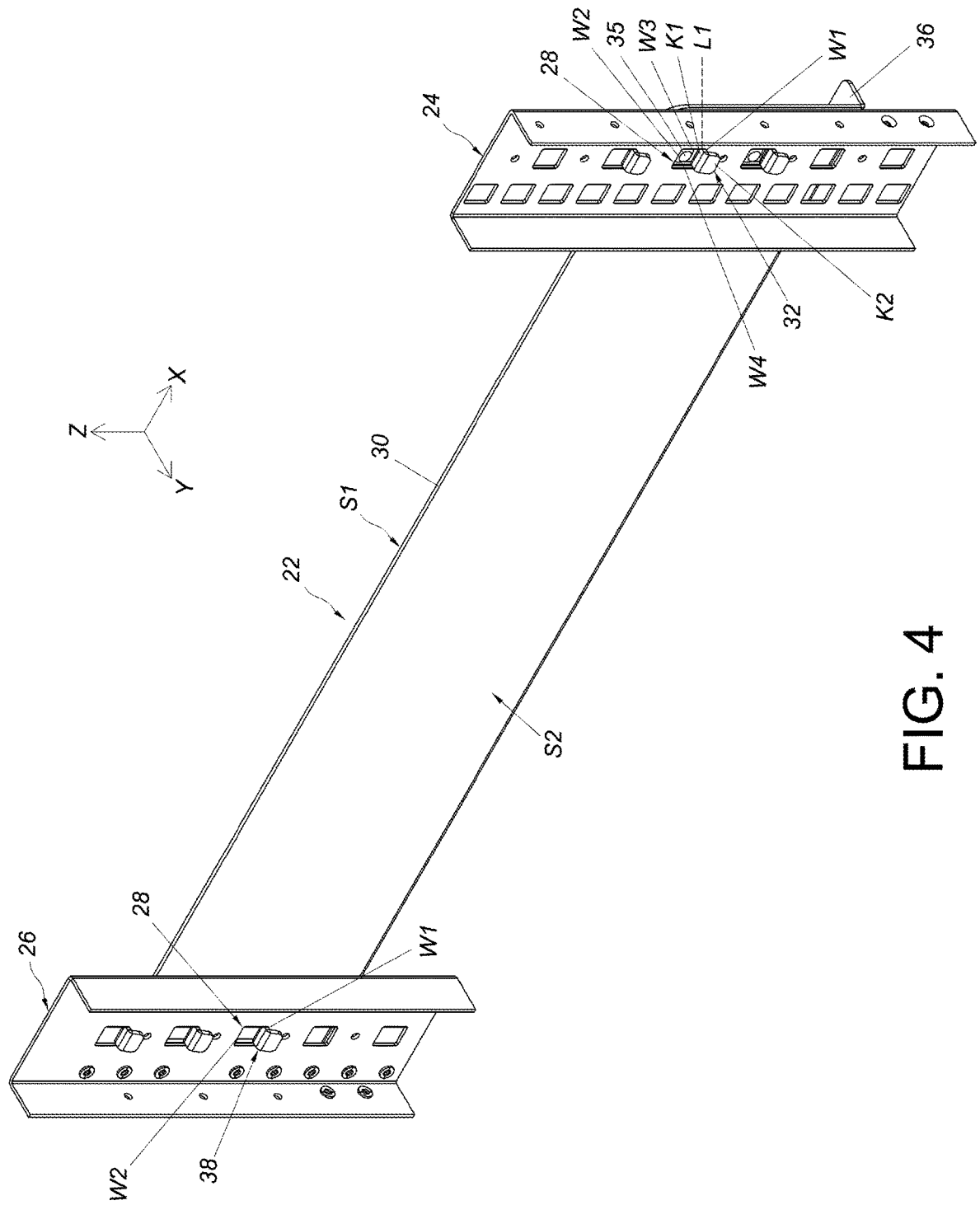
FIG. 4 shows that supporting device according to the embodiment of the present invention is mounted on the rack.
Figure 5:
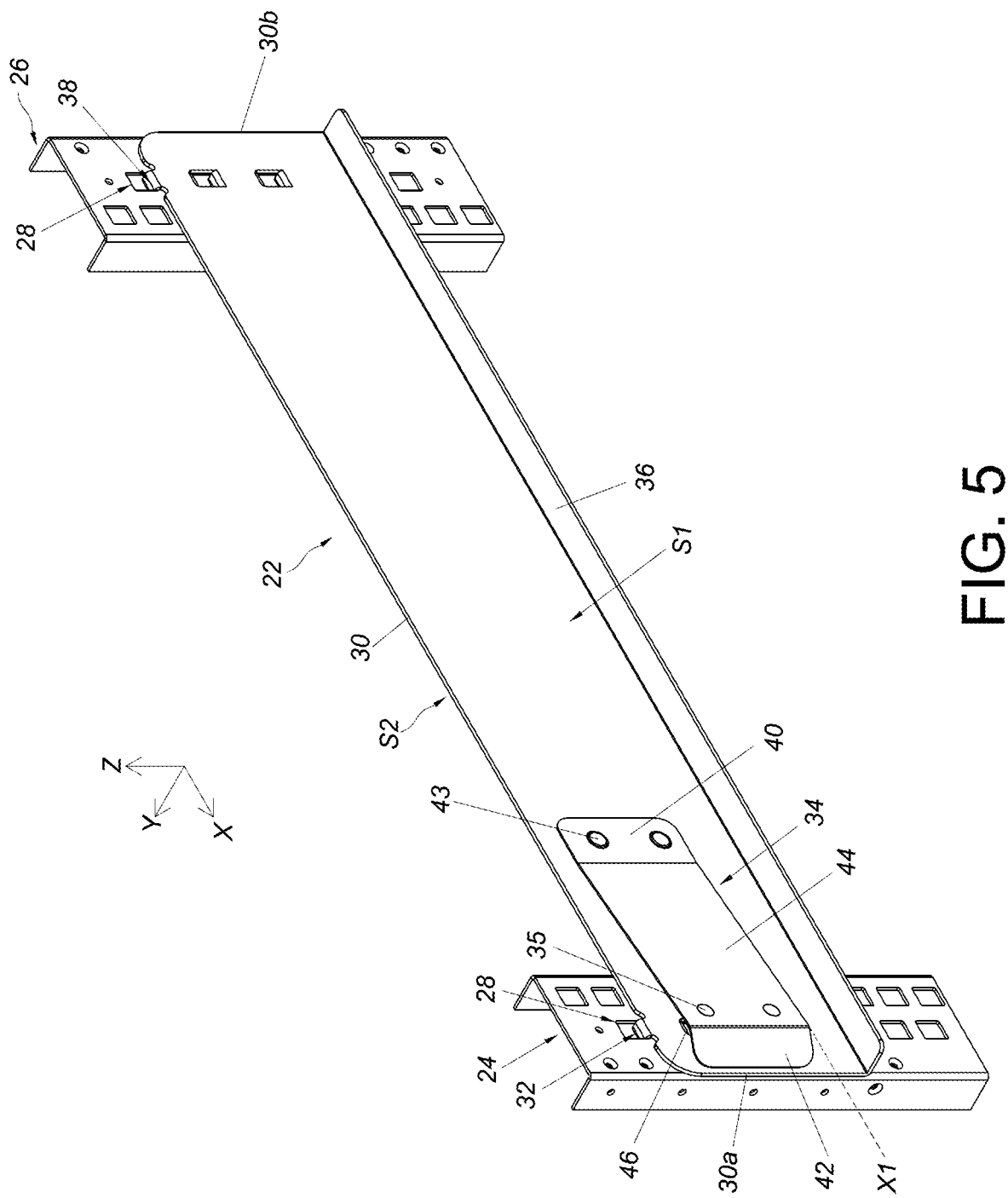
FIG. 5 shows the supporting device and the rack according to the embodiment of the present invention from another viewing angle.

Referring to FIG. 3, FIG. 4, and FIG. 5, the mounting holes 28 of the first post 24 and of the second post 26 have substantially the same structural configuration. Each mounting hole 28 is defined by the contours of its hole walls. For example, each mounting hole 28 is defined jointly by a lower hole wall W1, an upper hole wall W2, a front hole wall W3, and a rear hole wall W4 (see FIG. 3). In practice, the structural configuration of each mounting hole 28 is not limited to that disclosed herein.

The at least one first mounting portion 32 and the elastic member 34 of the supporting device 22 are both provided on the longitudinal portion 30. In this embodiment, there are a plurality of first mounting portions 32 by way of example only. The elastic member 34 is provided with a second mounting portion 35, such as but not limited to a projection.

Preferably, the longitudinal portion 30 of the supporting device 22 has two opposite sides defined respectively as a first side S1 and a second side S2. Each first mounting portion 32 includes a first extension section K1 and a second extension section K2. The first extension sections K1 are connected to the longitudinal portion 30, and the first extension sections K1 extend transversely (or laterally) beyond the second side S2. Each second extension section K2 is bent with respect to the corresponding first extension section K1, and in this embodiment, each second extension section K2 is substantially perpendicularly connected to the corresponding first extension section K1 by way of example. Each first extension section K1 and the corresponding second extension section K2 jointly constitute a hook to be hung on a hole wall (e.g., the lower hole wall W1) of any of the mounting holes 28 of the first post 24 such that the corresponding first mounting portion 32 is mounted at a first predetermined position L1 on the first post 24 (see FIG. 4).

Preferably, the longitudinal portion 30 of the supporting device 22 has a first end 30a and a second end 30b (such as but not limited to a front end and a rear end). The first mounting portions 32 are adjacent to the first end 30a of the longitudinal portion 30, and the longitudinal portion 30 is further provided with at least one auxiliary mounting portion 38 adjacent to the second end 30b of the longitudinal portion 30. In this embodiment, the number of the at least one auxiliary mounting portion 38 is the same as that of the at least one first mounting portion 32. The auxiliary mounting portions 38 have substantially the same structural configuration as the first mounting portions 32, and the way in which the auxiliary mounting portions 38 are mounted on the second post 26 is substantially the same as the way in which the first mounting portions 32 are mounted on the first post 24. More specifically, each auxiliary mounting portion 38 is configured to be hung on a hole wall (e.g., the lower hole wall W1) of any of the mounting holes 28 of the second post 26 and thus be mounted at a first predetermined position L1 on the second post 26 (see FIG. 4).

The elastic member 34 includes a connecting portion 40, a guiding portion 42, and an elastic portion 44 provided between the connecting portion 40 and the guiding portion 42. The connecting portion 40 is connected (e.g., fixedly connected) to a predetermined portion 43 of the first side S1 of the longitudinal portion 30. The elastic portion 44 is tilted up at a predetermined angle with respect to the first side S1 of the longitudinal portion 30 (see FIG. 5). The guiding portion 42 is bent with respect to the elastic portion 44 toward the first side S1 of the longitudinal portion 30 (see FIG. 5), and the guiding portion 42 includes, for example but not limited to, an inclined surface or a curved surface.

Preferably, the longitudinal portion 30 includes a through hole 46 that brings the first side S1 and the second side S2 into communication with each other, the second mounting portion 35 is provided on the elastic portion 44 of the elastic member 34, and the second mounting portion 35 can be passed from the first side S1 to the second side S2 through the through hole 46. The position of the second mounting portion 35 corresponds to one of the mounting holes 28 of the first post 24 (see FIG. 4).

Preferably, when each first mounting portion 32 is hung on a hole wall (e.g., the lower hole wall W1) of one of the mounting holes 28 of the first post 24, the first extension section K1 of each first mounting portion 32 is supported by the hole wall (e.g., the lower hole wall W1) of the corresponding mounting hole 28, and the second extension section K2 of each first mounting portion 32 is spaced apart from the first post 24 by a transverse distance. This transverse distance allows the supporting device 22 to be transversely displaced with respect to the rack (see FIG. 4).

Figure 6:
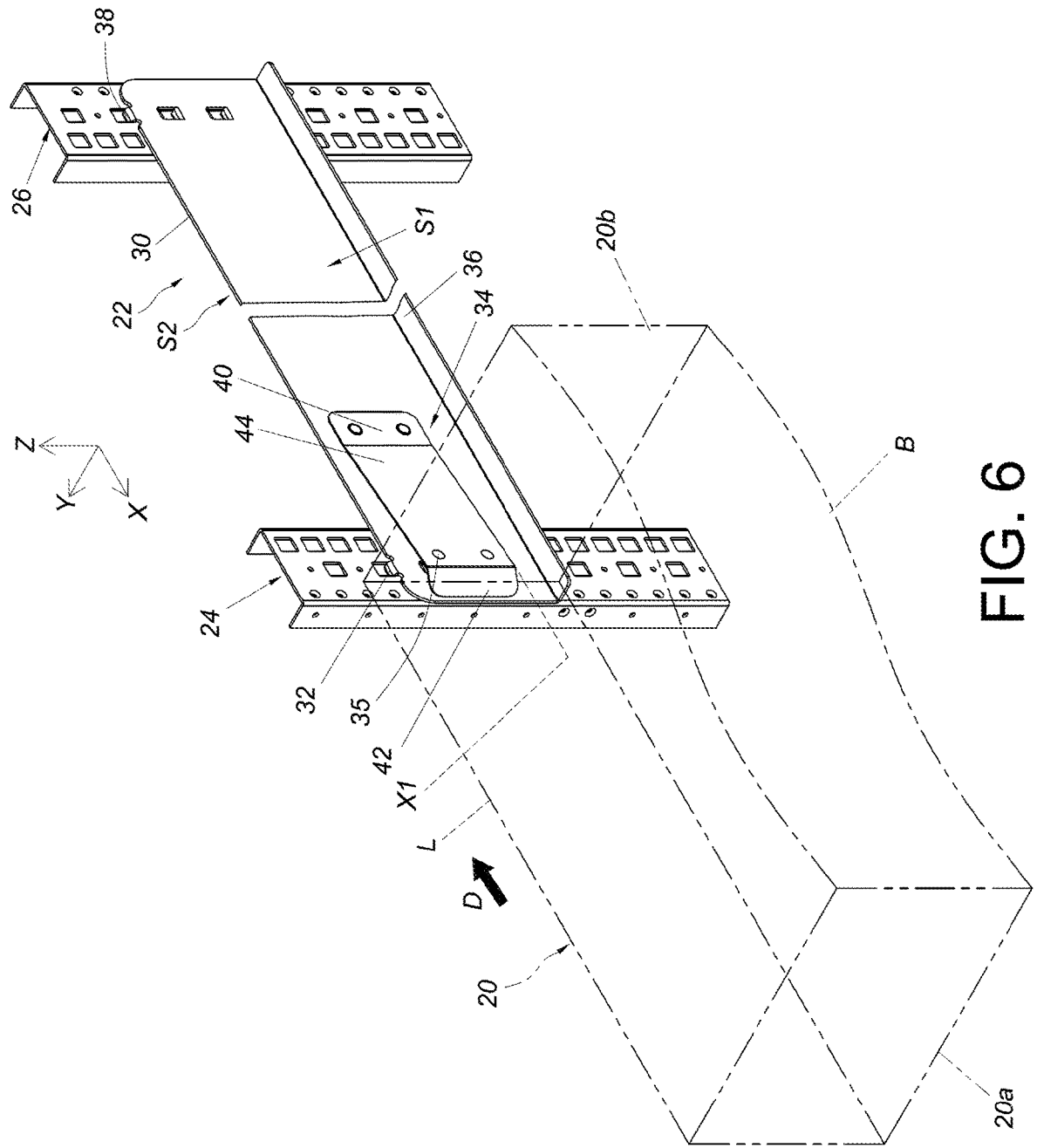
FIG. 6 shows from a first viewing angle that the object can be displaced in a predetermined direction in order to be mounted on the supporting device, which is mounted on the rack, according to the embodiment of the present invention.
Figure 7:
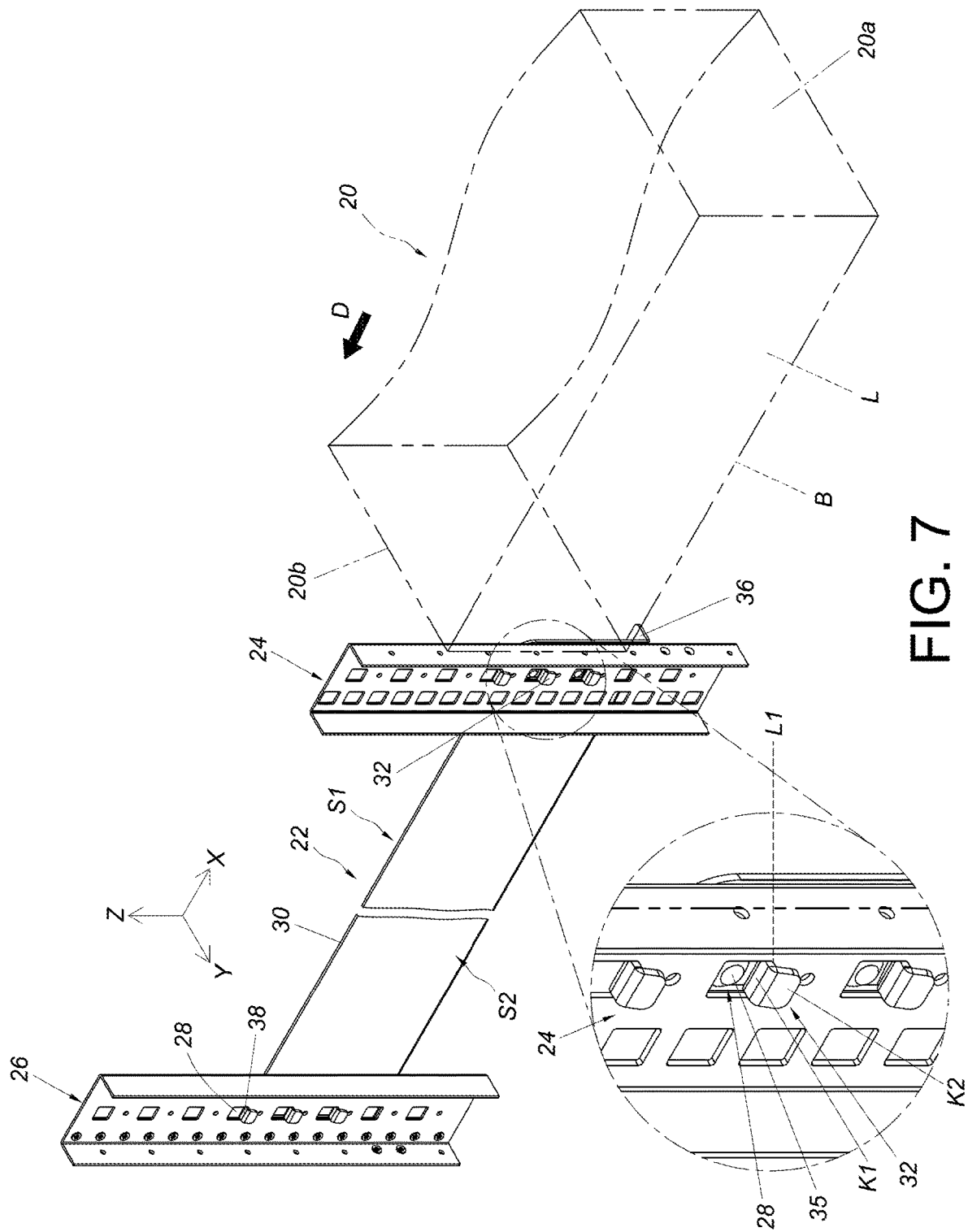
FIG. 7 shows from a second viewing angle that the object can be displaced in the predetermined direction in order to be mounted on the supporting device on the rack.

Referring to FIG. 6 and FIG. 7, the supporting device 22 is mounted (or hung) on the first post 24 and the second post 26 of the rack via the first mounting portions 32 and the auxiliary mounting portions 38 respectively, and the elastic member 34 is in a non-locking state X1 (e.g., an unlocking state as shown in FIG. 6). When the elastic member 34 is in the non-locking state X1, the elastic portion 44 of the elastic member 34 is tilted up at the predetermined angle with respect to the first side S1 of the longitudinal portion 30 (see FIG. 6), and the second mounting portion 35 corresponds in position to one of the mounting holes 28 of the first post 24 (as shown in FIG. 7, in which the second mounting portion 35 has yet to enter that mounting hole 28 of the first post 24). The object 20 can now be displaced in a predetermined direction D in order to be mounted on the supporting device 22. During the mounting process, the rear portion 20b of the object 20 will come into contact with the guiding portion 42 of the elastic member 34 (see FIG. 6), thus not only making it easier for a portion (e.g., a lateral side L) of the object 20 to move past the elastic member 34, but also allowing a bottom portion B of the object 20 to be partially supported by the supporting portion 36 (see FIG. 6 and FIG. 7). It can be seen in FIG. 6 and FIG. 7 that when the elastic member 34 is in the non-locking state X1 (see FIG. 6), the second mounting portion 35 is relatively far away from the first mounting portions 32 (see FIG. 7); for example, the second mounting portion 35 is not aligned with the first mounting portions 32 in the vertical direction (the Z-axis direction).

Figure 8:
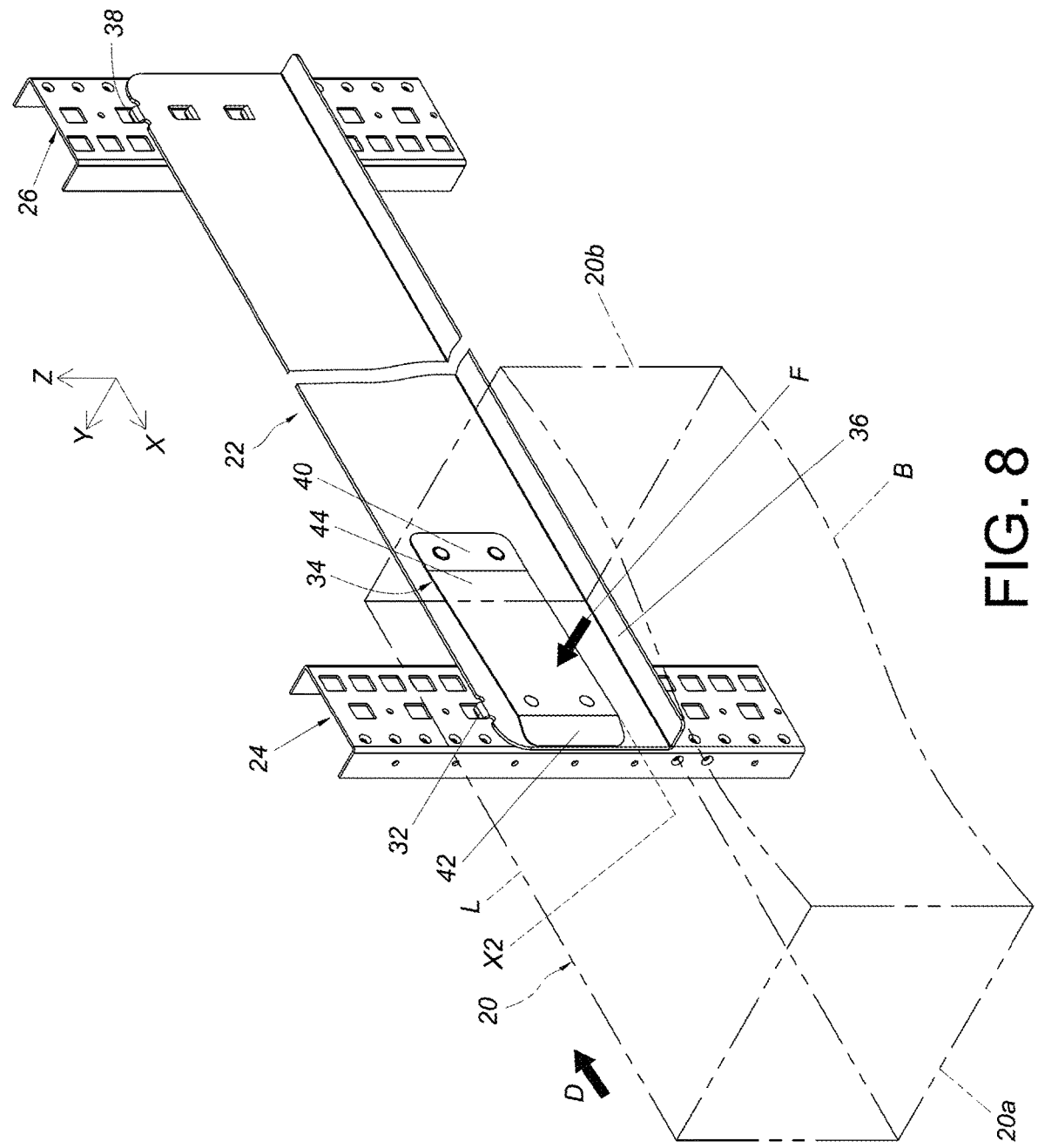
FIG. 8 shows from the first viewing angle that the object can be further displaced in the predetermined direction in order to be mounted on the supporting device on the rack.
Figure 9:
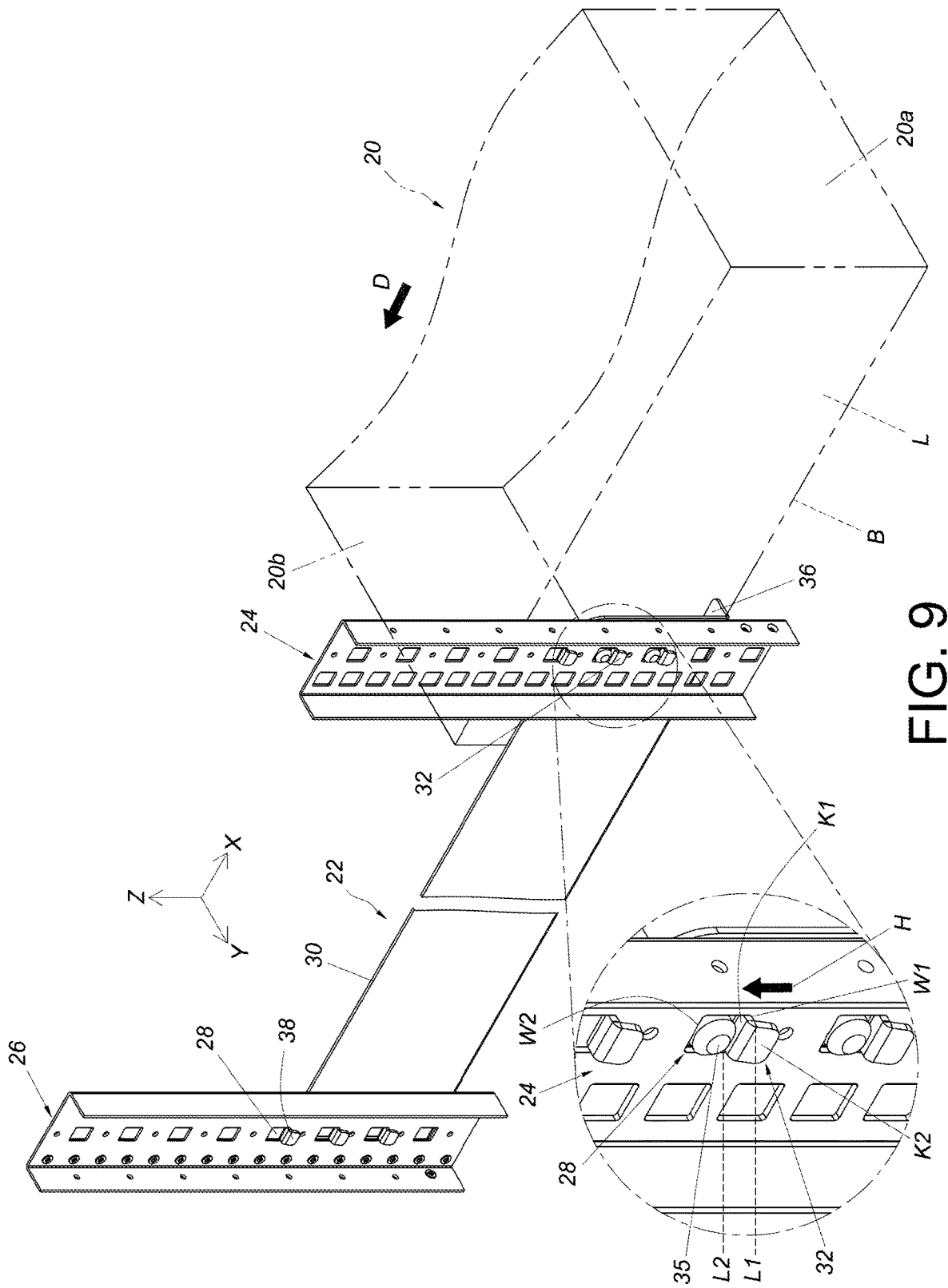
FIG. 9 shows from the second viewing angle that the object can be further displaced in the predetermined direction in order to be mounted on the supporting device on the rack.

Referring to FIG. 8 and FIG. 9, when the first mounting portions 32 are mounted at their respective first predetermined positions L1 on the first post 24 of the rack (e.g., when each first mounting portion 32 is hung on the lower hole wall W1 of one of the mounting holes 28 of the first post 24, as shown in FIG. 9) and a force F is applied to the elastic member 34 (see FIG. 8), the elastic member 34 is changed from the non-locking state X1 to a locking state X2 such that the second mounting portion 35 is mounted at a second predetermined position L2 on the first post 24 of the rack (e.g., with the second mounting portion 35 inserted in one of the mounting holes 28 of the first post 24, as shown in FIG. 9), thereby preventing the first mounting portions 32 from moving away from their respective first predetermined positions L1 on the first post 24 of the rack (e.g., preventing each first mounting portion 32 from moving away from the lower hole wall W1 of the corresponding mounting hole 28 of the first post 24 in a height direction H, as shown in FIG. 9); as a result, the supporting device 22 is locked to the rack. Preferably, when the second mounting portion 35 is mounted at the second predetermined position L2 on the first post 24 of the rack, the mounting gap between the second mounting portion 35 and the upper hole wall W2 of the mounting hole 28 in which the second mounting portion 35 is inserted is smaller than the extension length of the second extension section K2 of each first mounting portion 32, in order to prevent the first mounting portions 32 from moving away from their respective first predetermined positions L1 on the first post 24 of the rack (see FIG. 9). It is worth mentioning that the second predetermined position L2 corresponds to the same mounting hole 28 as a first predetermined position L1. More specifically, the first predetermined positions L1 are mounting positions whereas the second predetermined position L2 is a locking position.

The object 20 can be further pushed in the predetermined direction D in order to be mounted on the supporting device 22 completely. During the mounting process, the aforesaid portion (e.g., the lateral side L) of the object 20 applies the force F and thereby depresses the elastic portion 44 of the elastic member 34 (as shown in FIG. 8, with the elastic portion 44 of the elastic member 34 accumulating an elastic force that tends to act in the opposite direction of the force F) such that the elastic member 34 is changed from the non-locking state X1 to the locking state X2. The second mounting portion 35 ends up mounted at the second predetermined position L2 on the first post 24 of the rack (e.g., inserted in the corresponding mounting hole 28 of the first post 24, as shown in FIG. 9) to prevent the first mounting portions 32 from moving away from their respective first predetermined positions L1 on the first post 24 of the rack (e.g., to prevent each first mounting portion 32 from moving away from the lower hole wall W1 of the corresponding mounting hole 28 of the first post 24 in the height direction H, as shown in FIG. 9), and the supporting device 22 is thus securely locked to the rack. When the object 20 reaches a fully retracted position after being further displaced in the predetermined direction D, the bottom portion B of the object 20 is supported entirely by the supporting portion 36 of the supporting device 22 (see FIG. 1). It can be seen in FIG. 8 and FIG. 9 that when the elastic member 34 is in the locking state X2 (see FIG. 8), the second mounting portion 35 is relatively close to the first mounting portions 32 (see FIG. 9); for example, the second mounting portion 35 is adjacent to or aligned with the first mounting portions 32 in the vertical direction (the Z-axis direction).

It is worth mentioning that when the first mounting portions 32 are mounted at their respective first predetermined positions L1 on the first post 24 of the rack (e.g., when each first mounting portion 32 is mounted on the lower hole wall W1 of one of the mounting holes 28 of the first post 24) but the force F is not applied to the elastic member 34 (e.g., when the lateral side L of the object 20 has yet to depress the elastic portion 44 of the elastic member 34, or when the object 20 has been detached from the supporting device 22), the elastic portion 44 of the elastic member 34 releases the accumulated elastic force and returns from the locking state X2 to the non-locking state X1 such that the second mounting portion 35 is no longer mounted at the second predetermined position L2 on the first post 24 of the rack (e.g., the second mounting portion 35 is moved away from the corresponding mounting hole 28 of the first post 24 of the rack), thereby allowing the first mounting portions 32 to move away from their respective first predetermined positions L1 on the first post 24 of the rack in the height direction H and hence from the corresponding mounting holes 28 of the first post 24 of the rack respectively, and the auxiliary mounting portions 38 to move away from the corresponding mounting holes 28 of the second post 26 of the rack respectively, too. The supporting device 22, therefore, can be detached from the rack (or more specifically from the first post 24 and second post 26 of the rack) with ease.

Figure 10:
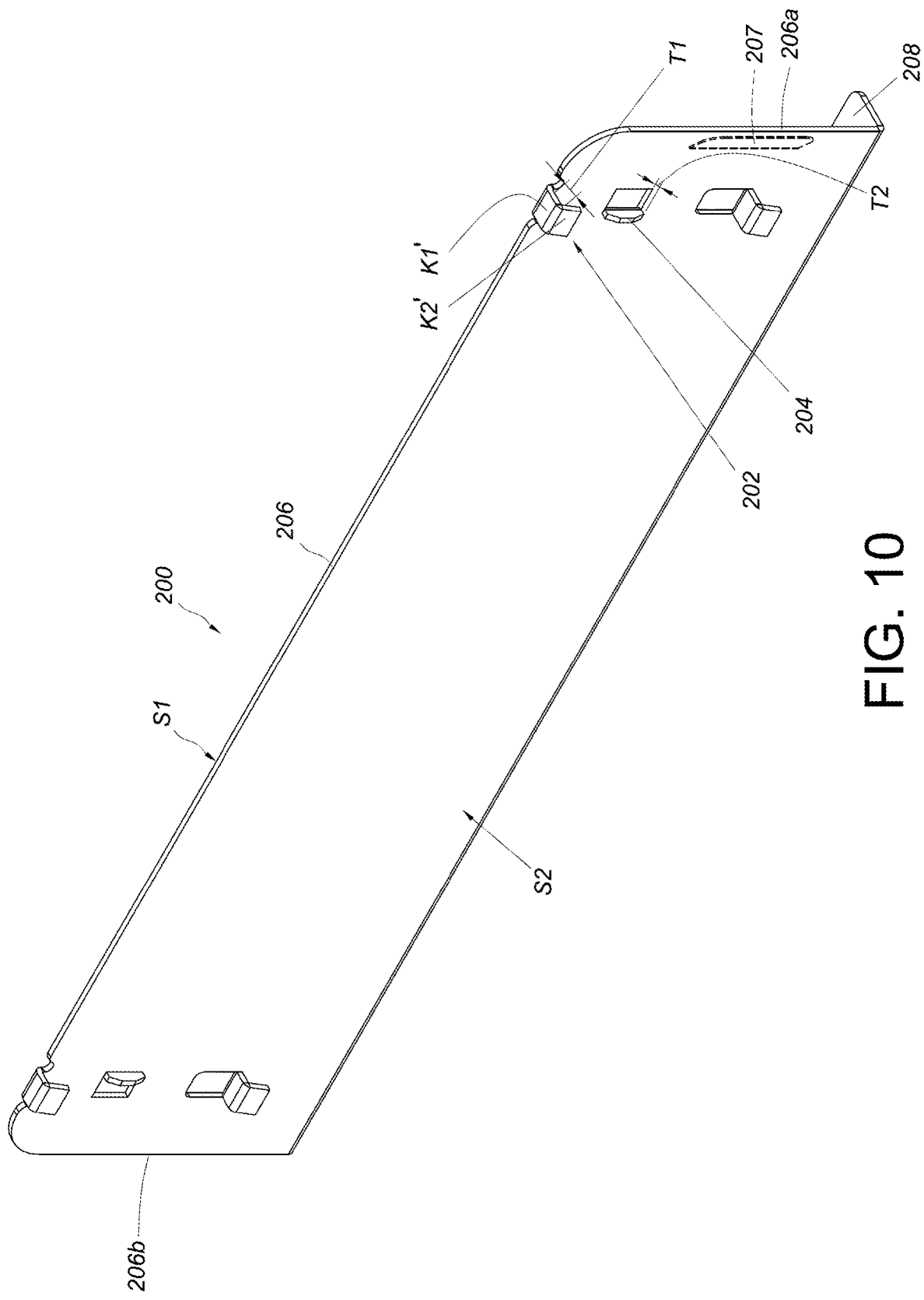
FIG. 10 is a perspective view of the supporting device according to another embodiment of the invention.

FIG. 10 depicts the supporting device 200 according to another embodiment of the present invention. The supporting device 200 in this embodiment is different from the supporting device 22 in the previous embodiment mainly in that the supporting device 200 does not include the elastic member 34 in the previous embodiment (i.e., the second mounting portion 204 of the supporting device 200 is not provided on the elastic member 34). More specifically, both the first mounting portion 202 and the second mounting portion 204 of the supporting device 200 are provided directly on the longitudinal portion 206. The first mounting portion 202 includes a first extension section K1' and a second extension section K2'. The first extension section K1' is connected to the longitudinal portion 206, and the first extension section K1' extends transversely (or laterally) beyond the second side S2 of the longitudinal portion 206. The second extension section K2' is bent with respect to the first extension section K1', and in this embodiment, the second extension section K2' is substantially perpendicularly connected to the first extension section K1' by way of example. The second mounting portion 204 extends transversely (or laterally) beyond the second side S2 of the longitudinal portion 206 too and is a projection by way of example. The first extension section K1' of the first mounting portion 202 has a first transverse length T1 extending from the second side S2 of the longitudinal portion 206, and the second mounting portion 204 has a second transverse length T2 extending from the second side S2 of the longitudinal portion 206. The second transverse length T2 is less than the first transverse length T1.

Figure 11:
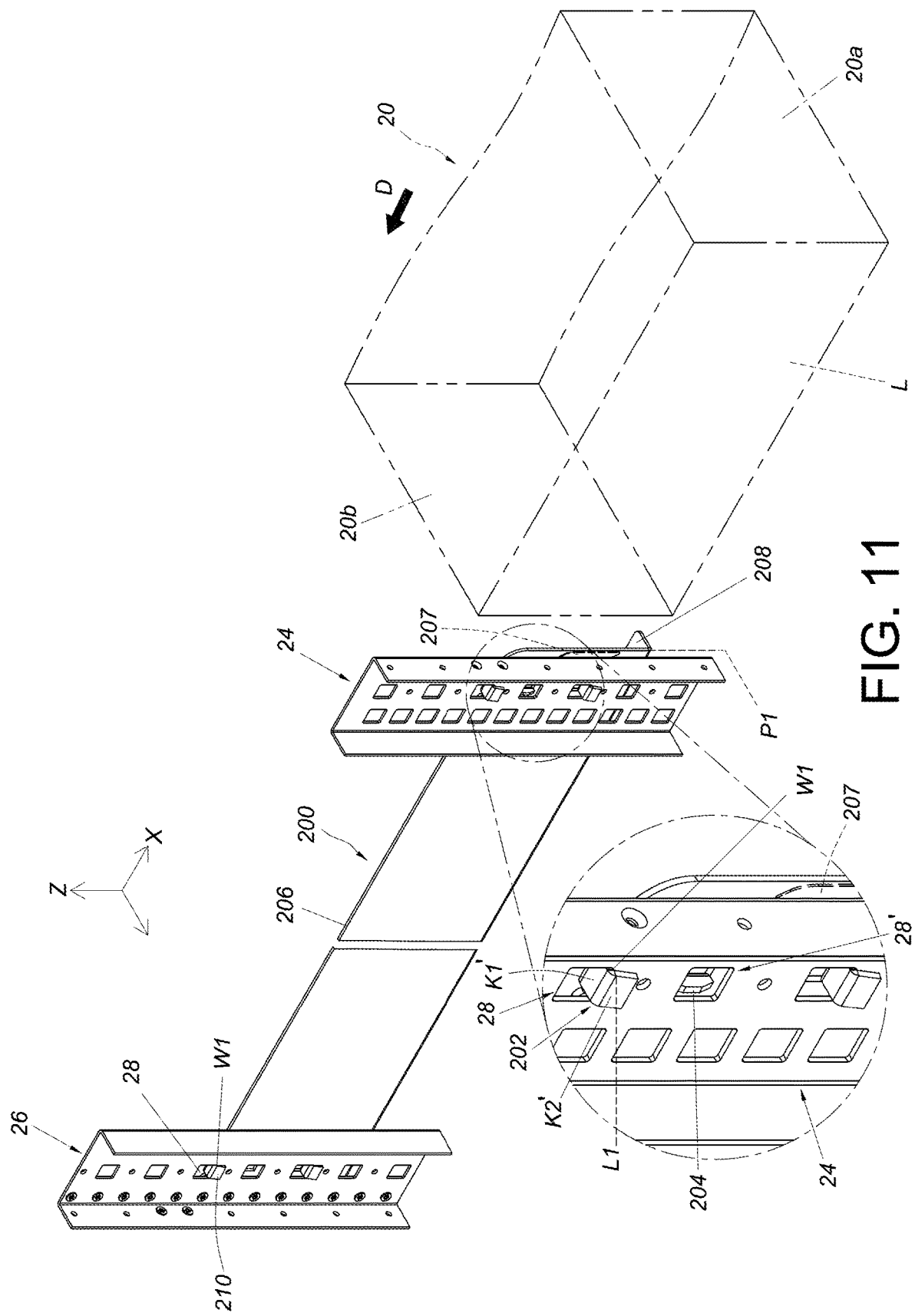
FIG. 11 shows that the supporting device according to said another embodiment of the invention is mounted on a rack, with an object displaced in a predetermined direction in order to be mounted on the supporting device.
Figure 12:
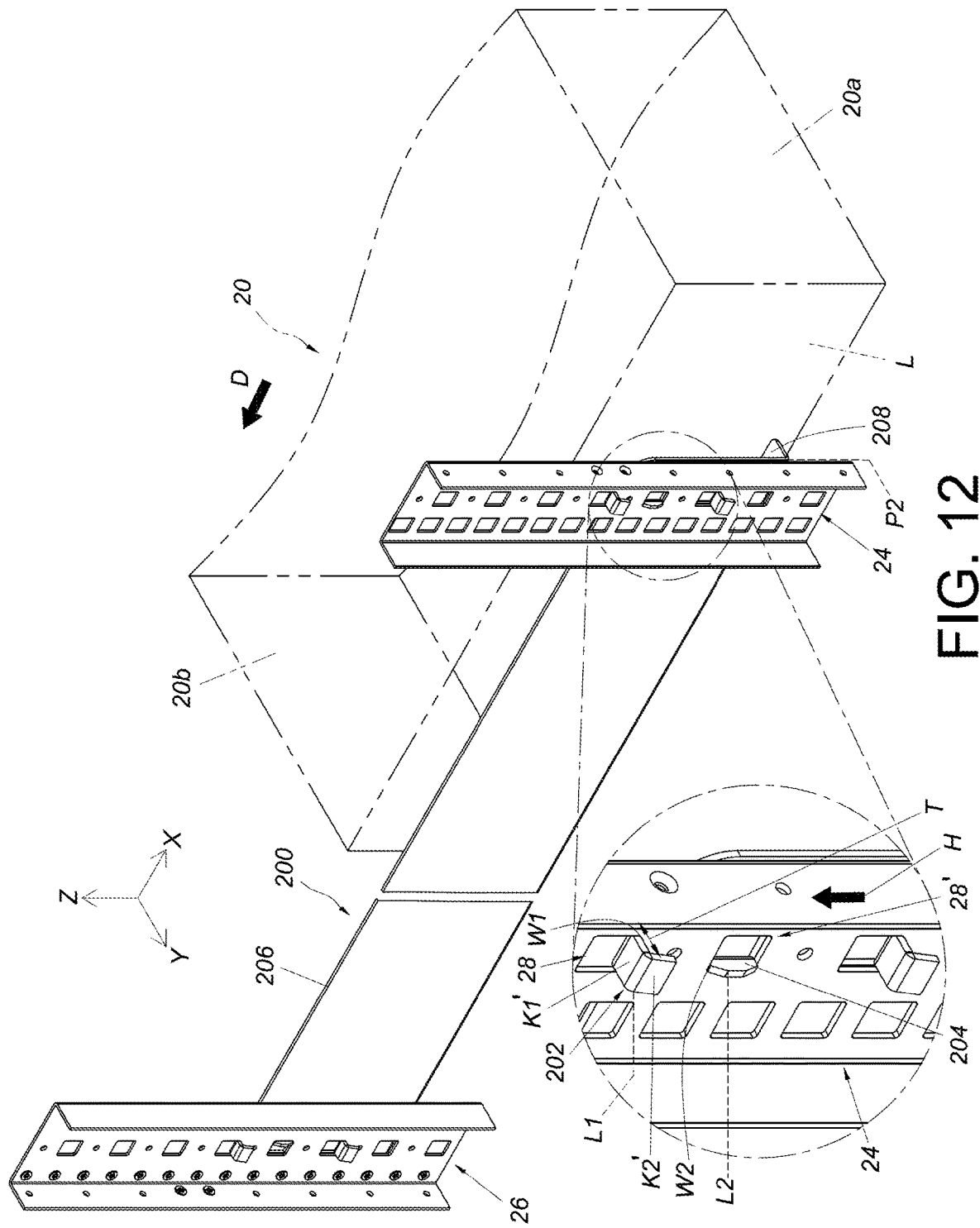
FIG. 12 shows that the supporting device according to said another embodiment of the invention is mounted on the rack, with the object further displaced in the predetermined direction in order to be mounted on the supporting device.

Referring to FIG. 11 and FIG. 12, the first extension section K1' and the second extension section K2' of the first mounting portion 202 jointly constitute a hook to be hung on a hole wall (e.g., the lower hole wall W1) of any of the mounting holes 28 of the first post 24 of the rack such that the first mounting portion 202 is mounted at a first predetermined position L1 on the first post 24.

When the first mounting portion 202 is hung on a hole wall (e.g., the lower hole wall W1) of one of the mounting holes 28 of the first post 24, the first extension section K1' of the first mounting portion 202 is supported by the hole wall (e.g., the lower hole wall W1), and the second extension section K2' of the first mounting portion 202 is spaced apart from the first post 24 by a transverse distance T (see FIG. 12). The transverse distance T allows the supporting device 200 to be transversely displaced with respect to the rack. For example, the supporting device 200 can be at a first position P1 (see FIG. 11) or a second position P2 (see FIG. 12) with respect to the rack.

When the supporting device 200 arrives at the second position P2 (see FIG. 12) after being transversely displaced with respect to the rack from the first position P1 (see FIG. 11), the second mounting portion 204 is mounted at a second predetermined position L2 on the first post 24 (e.g., the second mounting portion 204 is inserted in another mounting hole 28, say mounting hole 28', of the first post 24, as shown in FIG. 12) to prevent the first mounting portion 202 from moving away from the first predetermined position L1 on the rack (e.g., to prevent the first mounting portion 202 from moving away from the lower hole wall W1 of the corresponding mounting hole 28 of the first post 24 in the height direction H, as shown in FIG. 12); consequently, the supporting device 200 is locked to the rack. In this embodiment, the first predetermined position L1 and the second predetermined position L2 correspond to different mounting holes 28 respectively. The first predetermined position L1 is a mounting position whereas the second predetermined position L2 is a locking position.

Preferably, when the second mounting portion 204 is mounted at the second predetermined position L2 on the first post 24 of the rack, the mounting gap between the second mounting portion 204 and the upper hole wall W2 of the mounting hole 28' is smaller than the extension length of the second extension section K2' of the first mounting portion 202, in order to prevent the first mounting portion 202 from moving away from the first predetermined position L1 on the first post 24 of the rack (see FIG. 12).

Preferably, when the first mounting portion 202 is mounted at the first predetermined position L1 on the first post 24 of the rack (e.g., when the first mounting portion 202 is hung on the lower hole wall W1 of the corresponding mounting hole 28 of the first post 24) but the second mounting portion 204 is not mounted at the second predetermined position L2 on the rack (e.g., when the second mounting portion 204 has yet to be inserted in the mounting hole 28' of the first post 24, as shown in FIG. 11), the first mounting portion 202 is allowed to move away from the first predetermined position L1 on the first post 24 of the rack.

Preferably, the supporting portion 208 of the supporting device 200 is configured to support the object 20, and the object 20 can drive the supporting device 200 into transverse displacement from the first position P1 to the second position P2 with respect to the rack. For example, in the course in which the object 20 is displaced in the predetermined direction D in order to be mounted on the supporting device 200, a portion (e.g., the lateral side L) of the object 20 pushes the supporting device 200 and thereby displaces the supporting device 200 transversely from the first position P1 (see FIG. 11) to the second position P2 (see FIG. 12) with respect to the rack.

Preferably, one of the longitudinal portion 206 and the object 20 is provided with a guiding feature 207 such as an inclined surface or a curved surface (as shown in FIG. 10 and FIG. 11). Here, by way of example, the guiding feature 207 is adjacent to the first end 206a of the longitudinal portion 206 so that while the object 20 is being displaced in the predetermined direction D in order to be mounted on the supporting device 200, the guiding feature 207 makes it easier for the object 20 to push, and thereby transversely displace, the supporting device 200 from the first position P1 (see FIG. 11) to the second position P2 (see FIG. 12).

Preferably, the auxiliary mounting portion 210 is configured to be hung on a hole wall (e.g., the lower hole wall W1) of any of the mounting holes 28 of the post 26 so as to be mounted at a first predetermined position L1 on the second post 26 (as shown in FIG. 11 and FIG. 12).

It can be known from the above that the supporting device 22/200 of the present invention has the following features:

1. In the first embodiment of the present invention, the elastic member 34 can be changed from the non-locking state X1 to the locking state X2 by the force F applied to the elastic member 34 when the first mounting portions 32 are mounted at their respective first predetermined positions L1 on the rack, thus mounting the second mounting portion 35 at the second predetermined position L2 on the rack to prevent the first mounting portions 32 from moving away from their respective first predetermined positions L1 on the rack and to thereby lock the supporting device 22 to the rack. When the first mounting portions 32 are mounted at their respective first predetermined positions L1 on the rack but the force F is not applied to the elastic member 34, the elastic member 34 returns elastically from the locking state X2 to the non-locking state X1 such that the second mounting portion 35 is no longer mounted at the second predetermined position L2 on the rack. The first mounting portions 32 are therefore allowed to move away from their respective first predetermined positions L1 on the rack to unlock the supporting device 22 from the rack. In terms of actual application, when the elastic member 34 is not depressed by the object 20 or when the object 20 has been detached from the supporting device 22, the elastic member 34 is not subjected to the force F and hence returns elastically from the locking state X2 to the non-locking state X1, in which the second mounting portion 35 is not mounted at the second predetermined position L2 on the rack, meaning the supporting device 22 is not locked to, and can be easily detached from, the rack.

2. In the second embodiment of the present invention, the supporting device 200 can be displaced transversely with respect to the rack when the first mounting portion 202 is mounted (hung) on a hole wall (e.g., the lower hole wall W1) of one of the mounting holes 28 of the first post 24 and thus located at the first predetermined position L1. When the supporting device 200 is at the first position P1, the second mounting portion 204 of the supporting device 200 is not mounted at the second predetermined position L2 on the first post 24 of the rack, so the first mounting portion 202 can be moved away from the first predetermined position L1 on the first post 24 of the rack to unlock the supporting device 200 from the rack, allowing a user to easily detach the supporting device 200 from the rack. Once the supporting device 200 is transversely displaced with respect to the rack from the first position P1 to the second position P2, however, the second mounting portion 204 is mounted at the second predetermined position L2 on the first post 24 of the rack to prevent the first mounting portion 202 from moving away from the first predetermined position L1 on the first post 24 of the rack and to thereby lock the supporting device 200 to the rack.

While the present invention has been disclosed through the preferred embodiments described above, those embodiments are not intended to be restrictive of the scope of the invention. The scope of the patent protection sought by the applicant is defined by the appended claims.

What is claimed is:

1. A supporting device adapted to be mounted on a rack, the supporting device, comprising:
    a longitudinal portion, the longitudinal portion having two opposing sides defined, respectively, as a first side and a second side, wherein the first side faces away from the rack and the second side faces towards the rack, and the longitudinal portion extending between two opposing ends defined, respectively, as a first end and a second end;
    a first mounting portion provided on the longitudinal portion;
    an elastic member provided on the longitudinal portion, the elastic member being configured to be in one of a non-locking state responsive to a bias force thereof and a locking state responsive to an external force applied thereto sufficient to overcome the bias force, the elastic member being provided with a second mounting portion;
    wherein when the first mounting portion is mounted at a first predetermined position on the rack and the external force is applied to the elastic member, the elastic member is changed from the non-locking state to the locking state, thereby the second mounting portion is mounted at a second predetermined position on the rack to prevent the first mounting portion from being dismounted from the first predetermined position on the rack; and
    a supporting portion bent with respect to the longitudinal portion and formed on the first side of the longitudinal portion, the supporting portion defining a flange extending from the first side of the longitudinal portion in a direction away from the rack, the flange extending between the two opposing first and second ends of the longitudinal portion to thereby extend throughout a full length of the longitudinal portion, wherein the flange defined by the supporting portion is configured to support a bottom portion of an object, and responsive to the bottom portion of the object slidably engaging the flange defined by the supporting portion, the object applies the external force for overcoming the bias force of the elastic member to thereby change the elastic member from the non-locking state to the locking state.

2. The supporting device of claim 1, wherein responsive to the elastic member being in the non-locking state wherein the bias force of the elastic member maintains the second mounting portion displaced from the rack, the first mounting portion is able to move away from the first predetermined position on the rack.

3. The supporting device of claim 1, wherein the elastic member includes a connecting portion, a guiding portion, and an elastic portion provided between the connecting portion and the guiding portion, the connecting portion is connected to the first side of the longitudinal portion, and the elastic portion is tilted up with respect to the first side.

4. The supporting device of claim 3, wherein the longitudinal portion includes a through hole, the through hole brings the first side and the second side into communication with each other, the second mounting portion is provided on the elastic portion of the elastic member, and the second mounting portion is configured to be passed from the first side through the through hole to the second side.

5. The supporting device of claim 1, wherein the supporting portion is substantially perpendicularly connected to the longitudinal portion.

6. The supporting device of claim 1, wherein the rack includes a front post and a rear post, and each of the front post and the rear post includes a plurality of mounting holes; the first mounting portion is adjacent to the first end of the longitudinal portion, and the longitudinal portion is further provided with an auxiliary mounting portion adjacent to the second end of the longitudinal portion; and wherein the first mounting portion is configured to be mounted at the first predetermined position of any of the mounting holes of the front post, and the auxiliary mounting portion is configured to be mounted at the first predetermined position of any of the mounting holes of the rear post.

7. The supporting device of claim 6, wherein each of the first mounting portion and the auxiliary mounting portion includes a first extension section and a second extension section, the first extension sections are connected to the longitudinal portion, each said second extension section is bent with respect to a corresponding said first extension section, and each said first extension section and the corresponding second extension section jointly constitute a hook to be hung on a hole wall of any of the mounting holes of the front post or of the rear post.

8. The supporting device of claim 7, wherein each said second extension section is substantially perpendicularly connected to the corresponding first extension section.

9. The supporting device of claim 8, wherein when the first mounting portion is hung on the hole wall of one of the mounting holes of the front post, the first extension section of the first mounting portion is supported by the hole wall, and the second extension section of the first mounting portion is spaced apart from the front post by a transverse distance, the transverse distance allowing the supporting device to be displaced transversely with respect to the rack.

10. A supporting device configured to be mounted onto a rack, the supporting device, comprising:
    a longitudinal portion, the longitudinal portion having two opposing sides defined, respectively, as a first side and a second side, wherein the first side faces away from the rack and the second side faces towards the rack;
    a first mounting portion provided on the longitudinal portion;
    an elastic member provided on the longitudinal portion, the elastic member being configured to be in one of a non-locking state responsive to a bias force thereof and a locking state responsive to an external force applied thereto sufficient to overcome the bias force, the elastic member being provided with a second mounting portion;
    wherein the second mounting portion is disposed in spaced relationship from the first mounting portion in a direction transverse with respect to a longitudinal direction of the longitudinal portion when the elastic member is in the non-locking state; and
    wherein the second mounting portion is disposed proximate to the first mounting portion in the transverse direction when the elastic member is in the locking state; and
    a supporting portion bent with respect to the longitudinal portion and formed on the first side of the longitudinal portion, the supporting portion defining a flange extending from the first side of the longitudinal portion in a direction away from the rack, the flange extending between opposing ends of the longitudinal portion to thereby extend throughout a full length of the longitudinal portion, wherein the flange defined by the supporting portion is configured to support a bottom portion of an object, and responsive to the bottom portion of the object slidably engaging the flange defined by the supporting portion, the object applies the external force for overcoming the bias force of the elastic member to thereby change the elastic member from the non-locking state to the locking state.

11. The supporting device of claim 10, wherein the bias force of the elastic member in the non-locking state positions the second mounting portion in the transverse direction from the first mounting portion and thereby enables the supporting device to be the mounted to or dismounted from the rack.

12. A supporting device adapted to be mounted on a rack, wherein the rack includes a first post, and the first post includes a plurality of mounting holes, the supporting device, comprising:
a longitudinal portion, the longitudinal portion having two opposing sides defined, respectively, as a first side and a second side, wherein the first side faces away from the rack and the second side faces towards the rack, and the longitudinal portion extending between two opposing ends defined, respectively, as a first end and a second end;
a first mounting portion and a second mounting portion, and both of the first and second mounting portions being fixedly provided on the longitudinal portion;
wherein the first mounting portion includes a first extension section and a second extension section, the first extension section is connected to the longitudinal portion, the second extension section is bent with respect to the first extension section, and the first extension section and the second extension section jointly constitute a hook to be hung on a hole wall of any of the plurality of mounting holes of the first post and thus to thereby be located at a first predetermined position;
wherein when the first mounting portion is hung on the hole wall of one of the plurality of mounting holes, the first extension section of the first mounting portion is supported by the hole wall, and the second extension section of the first mounting portion is spaced apart from the first post by a lateral transverse distance, the lateral transverse distance allowing the supporting device to be correspondingly displaced laterally with respect to the rack;
wherein when the supporting device is displaced in a lateral transverse direction with respect to the rack to a second position from a first position, the second mounting portion is passed into another of the plurality of mounting holes at a second predetermined position on the rack, and responsive to the second mounting portion being displaced into the other of the plurality of mounting holes, the first mounting portion is prevented from being disengaged from the first predetermined position on the rack; and
a supporting portion bent with respect to the longitudinal portion and formed on the first side of the longitudinal portion, the supporting portion defining a flange extending from the first side of the longitudinal portion in a direction away from the rack, the flange extending between the two opposing first and second ends of the longitudinal portion to thereby extend throughout a full length of the longitudinal portion, wherein the flange defined by the supporting portion is configured to support a bottom portion of an object, and responsive to the bottom portion of the object slidably engaging the flange defined by the supporting portion, slidable engagement between the object and the flange responsively drives the supporting device via the object into displacement in the lateral transverse direction from the first position to the second position.

13. The supporting device of claim 12, wherein the first extension section of the first mounting portion has a first length in the lateral transverse direction, and the second mounting portion has a second length in the lateral transverse direction less than the first length.

14. The supporting device of claim 13, wherein when the first mounting portion is mounted at the first predetermined position on the rack and the second mounting portion is displaced from the other of the plurality of mounting holes, the first mounting portion is able to move away from the first predetermined position on the rack.

15. The supporting device of claim 12, wherein the supporting portion is substantially perpendicularly connected to the longitudinal portion.

16. The supporting device of claim 12, wherein the rack further includes a second post, and the second post includes a plurality of mounting holes; the first mounting portion is adjacent to the first end of the longitudinal portion, and the longitudinal portion is further provided with an auxiliary mounting portion adjacent to the second end of the longitudinal portion; wherein the first mounting portion is configured to be mounted at the first predetermined position of any of the plurality of mounting holes of the first post, and the auxiliary mounting portion is configured to be mounted at the first predetermined position of any of the plurality of mounting holes of the second post.

17. The supporting device of claim 16, wherein the auxiliary mounting portion is substantially identical to the first mounting portion in structural configuration, and the auxiliary mounting portion is configured to be hung on a hole wall of any of the plurality of mounting holes of the second post.

18. The supporting device of claim 17, wherein the second extension section is substantially perpendicularly connected to the first extension section.

* * * * *